(12) United States Patent
Jeong et al.

(10) Patent No.: US 6,229,205 B1
(45) Date of Patent: May 8, 2001

(54) SEMICONDUCTOR DEVICE PACKAGE HAVING TWICE-BENT TIE BAR AND SMALL DIE PAD

(75) Inventors: Do Soo Jeong, Kyungki-do; Kyung Seob Kim, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/081,566

(22) Filed: May 19, 1998

(30) Foreign Application Priority Data

Jun. 30, 1997 (KR) .................................. 97-29706

(51) Int. Cl.[7] .................................................. H01L 23/495
(52) U.S. Cl. .......................... 257/676; 257/666; 257/670; 257/669; 257/696; 257/674; 257/672; 257/692
(58) Field of Search ..................................... 257/666, 676, 257/696, 669, 670, 672, 674, 692

(56) References Cited

U.S. PATENT DOCUMENTS

| 4,942,452 | * | 7/1990 | Kitano et al. | 257/666 |
|---|---|---|---|---|
| 5,210,307 | * | 5/1993 | Davis | 257/676 |
| 5,214,307 | * | 5/1993 | Davis | 257/676 |
| 5,327,008 | * | 7/1994 | Djennas et al. | 257/666 |
| 5,389,739 | * | 2/1995 | Mills | 257/666 |
| 5,637,913 | * | 6/1997 | Kajihara et al. | 257/666 |
| 5,698,904 | * | 12/1997 | Tsuji | 257/795 |
| 5,859,471 | * | 7/1994 | Kuraishi et al. | 257/666 |

FOREIGN PATENT DOCUMENTS

| 5-211271 | 8/1993 | (JP) . |
|---|---|---|
| 7-235629B1 | 9/1995 | (JP) . |

* cited by examiner

Primary Examiner—Tom Thomas
Assistant Examiner—Lun Thai
(74) Attorney, Agent, or Firm—Jones Volentine, L.L.C.

(57) ABSTRACT

A semiconductor device package includes a die pad to which a semiconductor chip is vertically attached, having a smaller horizontal size than a horizontal size of the semiconductor chip. The package includes a plurality of inner leads which are electrically connected to the semiconductor chip, a plurality of outer leads each of which is integral with a respective one of the plurality of inner leads, a tie bar, and a package body for encapsulating the semiconductor chip, the die pad, and the plurality of inner leads. The tie bar for supporting the die pad has a downward bend effecting a downward vertical displacement from the die pad, and has a laterally spaced apart upward bend effecting an upward vertical displacement from the die pad. This package prevents imperfect encapsulation and resulting problems such as cracking of the package, and reduces damage to the die pad, such as warping of the die pad.

13 Claims, 5 Drawing Sheets

SEMICONDUCTOR DEVICE PACKAGE HAVING TWICE-BENT TIE BAR AND SMALL DIE PAD

BACKGROUND OF THE INVENTION

1. Field of the Invention

The present invention relates to a semiconductor device package, and more particularly to a semiconductor device package having a twice-bent tie bar and a small die pad, in order to prevent both imperfect encapsulation by the molding compound that forms the package body and any resulting damage to the die pad by the molding compound.

2. Description of the Related Art

There are continuing efforts to improve the reliability of the plastic package technology for encapsulating semiconductor devices. A main cause for the lack of reliability in the plastic packages has been that materials having different physical characteristics are in contact with each other. For example, differences in coefficient of thermal expansion among a molding compound which forms the package body, a semiconductor chip which is made of silicon (Si), and a lead frame which consists of copper (Cu) or iron (Fe) alloy, can cause separation of the materials during subsequent processing, testing, and use.

Generally, there are two approaches for improving the reliability of the package; one approach addresses the materials and the other approach addresses the processes. The material approach includes improving the adhesion strength of the molding compound that forms the package body, and selecting the coefficient of thermal expansion of the lead frame and molding compound to be the same as that of the semiconductor chip. The process approach includes increasing the area of direct contact between the molding compound and the surface of the semiconductor chip by forming a through hole in the center of a die pad on which the semiconductor chip is mounted, as disclosed in U.S. Pat. No. 4,942,452.

In the case of the lead frame having a die pad with a through hole in the center, it is difficult to use the same lead frame in packaging many various kinds of semiconductor chips. Therefore, in order to overcome this disadvantage, newer approaches use a small-sized die pad, i.e., a die pad having a smaller size than the size of the semiconductor chip. Then the molding compound can directly contact the bottom surface of the semiconductor chip extending beyond the outside edges of the die pad.

FIG. 1 is a cross-sectional view depicting a conventional semiconductor device package using a small-sized die pad. With reference to FIG. 1, a lead frame is composed of a die pad 10 on which a semiconductor chip 12 is mounted and a plurality of leads 14 for electrically connecting the semiconductor chip 12 to the external apparatus (not shown) by a plurality of bonding wires 16. The semiconductor chip 12 is attached to the upper surface of the die pad 10 by an adhesive layer 15. The package body 18 is formed around the chip 12, leads 14 and bonding wires 16 by injecting a molding compound. Because the die pad 10 has a smaller size than that of the semiconductor chip 12, the molding compound directly contacts the bottom surface of the outside edge of the semiconductor chip 12 extending beyond the die pad 10. Therefore, the total adhesion strength between the semiconductor chip and the molding compound can be increased, and thereby, the reliability of the package can be improved. The small-sized die pad provides more flexibility in that the same lead frame can be used with many more kinds of semiconductor chips.

However, in the case of the lead frame having the small-sized die pad 10, a space is formed between an upper surface of a tie bar (not shown), extending from either side of the die pad 10 into and out of the page as viewed in FIG. 1, and the lower surface of the semiconductor chip 12. The height of this space, usually several microns ($\mu$m), is the same as the thickness of the adhesive layer 15. In the specific case of an Ag-epoxy adhesive, the height of the space is about 6 $\mu$m to 8 $\mu$m.

This space can cause failures by, for example, the imperfect encapsulation of the molding compound which can leave voids in this space. Furthermore, the die pad can be warped during the molding process due to uneven filling of the molding compound, thus damaging the die pad.

In addition, the non-hermetic plastic package body absorbs moisture from the external environment through diffusion. As the moisture penetrates into the package body along the boundary between the tie bar and the package body, this moisture can cause package cracking. The moisture delaminates the package at the interface between the die pad and the molding compound due to the expansion and the contraction of the moisture during either the assembly process or the reliability test in which the semiconductor device is subjected to high temperature, high humidity, and high pressure conditions.

The reliability of packages for semiconductor devices is also affected by the increased number of inner leads encapsulated in the package. As the number of inner leads increases, and the size of the die pad decreases, the pitch between neighboring inner leads becomes more fine and the width of the inner leads and tie bar becomes thinner. All these factors increase the chance that the liquid molding compound injected to form the package body will deflect the inner leads or tie bar and cause electrical failures in the finished package.

Therefore, what is needed is a semiconductor package with increased reliability due to increased direct contact between the molding compound and the semiconductor chip without causing voids in the layer between the tie bar and the package body and without causing electrical failures by deflecting thinner tie bars and inner leads.

SUMMARY OF THE INVENTION

Accordingly, an object of the present invention is to provide a semiconductor device package that prevents imperfect encapsulation of a molding compound, damage to a die pad by the molding compound in the molding process, and package cracking by the diffusion of moisture through the boundary between the tie bar and the package body.

These and other objects and advantages of the present invention are achieved by a semiconductor device package comprising a die pad to which a semiconductor chip is vertically attached, having a smaller horizontal size than a horizontal size of the semiconductor chip. The package includes a plurality of inner leads which are electrically connected to the semiconductor chip and a plurality of outer leads, each of which is integral with a respective one of the plurality of inner leads. A package body encapsulates the semiconductor chip, the die pad, and the plurality of inner leads. A tie bar which supports the die pad, has a downward bend effecting a downward vertical displacement within the perimeter of the semiconductor chip an upward bend effecting an upward vertical displacement beyond the perimeter of the die pad.

BRIEF DESCRIPTION OF THE DRAWINGS

Preferred embodiments of the present invention are described below with reference to the accompanying drawings, in which like reference numerals designate like structural elements, and in which.

DETAILED DESCRIPTION OF THE PREFERRED EMBODIMENTS

Figure 1:
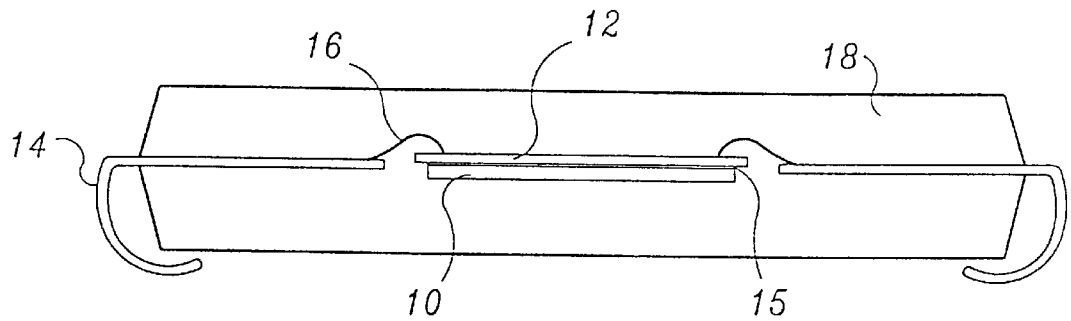
FIG. 1 is a cross-sectional view depicting a conventional semiconductor device package using a small-sized die pad.
Figure 2A:
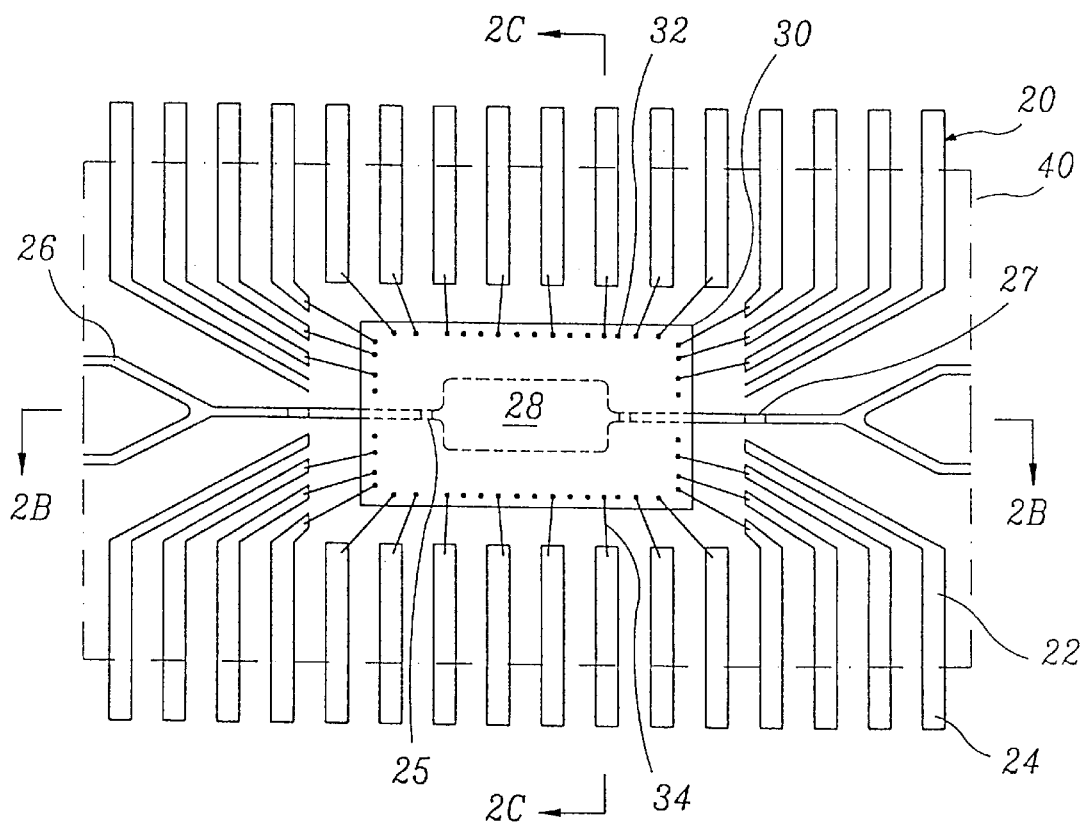
FIG. 2A is a plan view depicting a semiconductor device package using a small-sized die pad according to the present invention.
Figure 2B:
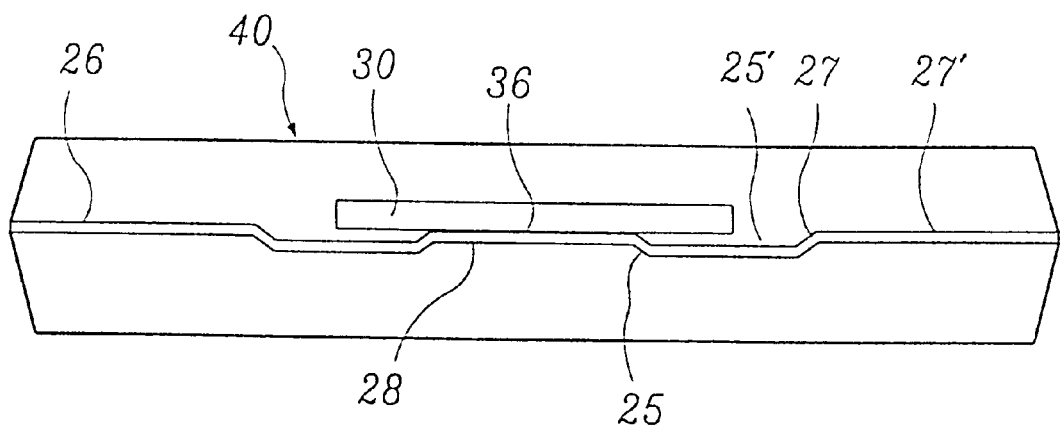
FIG. 2B is a cross-sectional view taken along the line 2B—2B in FIG. 2A.
Figure 2C:
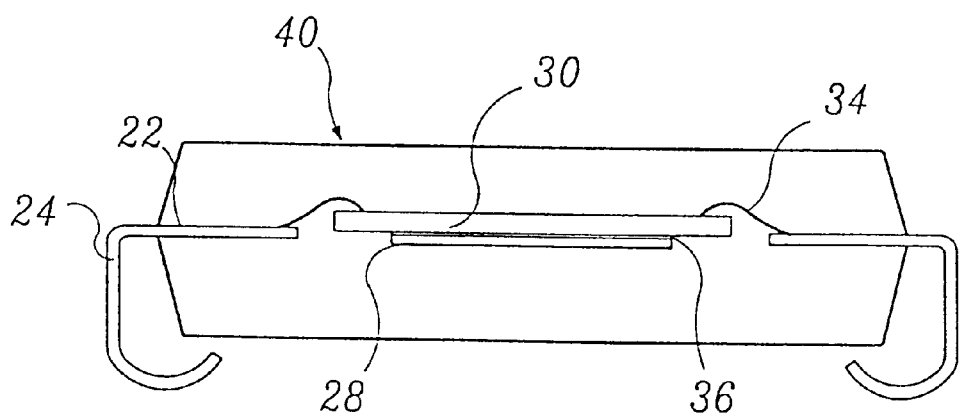
FIG. 2C is a cross-sectional view taken along the line 2C—2C in FIG. 2A.

FIG. 2A is a plan view depicting a semiconductor device package which uses a small-sized die pad according to the present invention. FIG. 2B and FIG. 2C are cross-sectional views taken along the lines 2B—2B and 2C—2C in FIG. 2A, respectively. With reference to FIG. 2A, a lead frame 20 is provided with a plurality of inner leads 22 a plurality of outer leads 24, tie bars 26, and a die pad 28. A semiconductor chip 30 is attached to the upper surface of the die pad 28 using an adhesive such as an Ag-epoxy. The die pad 28 has a horizontal size much smaller than that of the semiconductor chip 30. A plurality of electrode pads 32 are formed on an active upper surface of the semiconductor chip 30 and connected to respective ones of the inner leads 22 of the lead frame 20 by bonding wires 34. The electrode pads 32 are terminals for electrical connection of the semiconductor chip 30 to external devices. A package body 40 is formed in the shape indicated by the dashed line by injecting a liquid molding compound into a mold of that size and shape, and then hardening the compound. The package body protects the semiconductor chip 30 and the inner leads 22 of the lead frame 20 from the external environmental stress, while exposing the outer leads 24. Because the die pad 28 has a smaller size than that of the semiconductor chip 30, the contact surface can be reduced between the different materials of the die pad, such as copper (Cu) or iron (Fe) alloy, and the semiconductor chip. Further, because the molding compound, which forms the package body, directly contacts an additional area on the bottom surface of the semiconductor chip extending beyond the die pad, the total adhesion strength between the semiconductor chip and the molding compound increases.

The tie bars 26 of the lead frame 20 mechanically support the die pad 28 by connecting the die pad 28 to the side rail (not shown) of the lead frame. As shown in FIG. 2B, each tie bar 26 has a twice-bent structure. The twice-bent structure is accomplished by bending the tie bar 26 downwards in a downward bend 25 for a down-bend distance at a location within the perimeter of the semiconductor chip 28, and upwards in an up-bend 27 for an up-bend distance at a location outwardly spaced from the perimeter of the die pad 28. As shown in FIG. 2B the downward bend 25 effects a downward vertical displacement between the height of the die pad 28 and the height of a down-set portion 25' of the tie bar. The upward bend 27 effects an upward vertical displacement between the height of the down-set portion 25' of the tie bar and the height of an up-set portion 27' of the tie bar.

With the twice-bent tie bar, the space between the bottom surface of the semiconductor chip 30 and the upper surface of the tie bar 26 can be assured to be sufficiently large to allow liquid molding compound to flow evenly and without obstruction into the space. Therefore, imperfect encapsulation by the molding compound and damage to the die pad 28 in the molding process can be prevented. Further, since the tie bars 26 are bent, not straight, the diffusion of moisture through the interface between the tie bar 26 and the molding compound can be blocked, thus preventing that moisture from penetrating easily into the package body, and preventing the resulting cracking.

In the preferred embodiment, an upward bend 27 of the tie bar 26 is formed at a location which is about 0.5 mm from the side edge of the package body, and a downward bend 25 of the tie bar 26 is formed at a location which is about 0.2 mm inside the perimeter of the semiconductor chip 28. It should be noted that the upward vertical displacement of the upward bend 27, and the downward vertical displacement of the downward bend 25, are each larger than the size of a filler which is contained in the epoxy molding compound. The filler limits the spaces into which the molding compound can readily flow. Therefore, the epoxy molding compound flows smoothly during the molding process, and defects such as voids due to imperfect encapsulation by the molding compound can be prevented. In the preferred embodiment, the upward vertical displacement and the downward vertical displacement are each usually about 100 μm.

Further, an optimum vertical structure can be obtained by selecting the bending angle of the upward bend and the downward bend. Optimal selection can prevent warping of the package body during molding, and prevent cracking of the package after the molding process by ensuring that the semiconductor chip is positioned in the center of the package body. The semiconductor chip can be guided to the center of the package body by controlling the upward vertical displacement and the downward vertical displacement of the present invention, considering the thickness of the semiconductor chip and the package body. For example, the upward vertical displacement can be selected to be greater than the downward vertical displacement by an amount that is close to the thickness (i.e., the vertical size) of the semiconductor chip and that is small compared to the thickness of the package body.

There are two methods for forming the twice-bent tie bar, depending on the apparatus for manufacturing the lead frame. One method forms the upward bend and the downward bend on the tie bar simultaneously. The other method forms the upward bend and the downward bend separately in sequence. In either method, the lead frame can be manufactured by the following process. First, the metal plate which is made of copper (Cu) or iron (Fe) alloy is patterned into a plurality of inner leads, a plurality of outer leads, a die pad and tie bars by a photolithography method or a stamping method. Then, the surface of the lead frame is plated with materials such as silver (Ag). The bending process, which forms the upward bend and the downward bend on the tie bar, may be carried out after the above plating process.

Figure 3A:
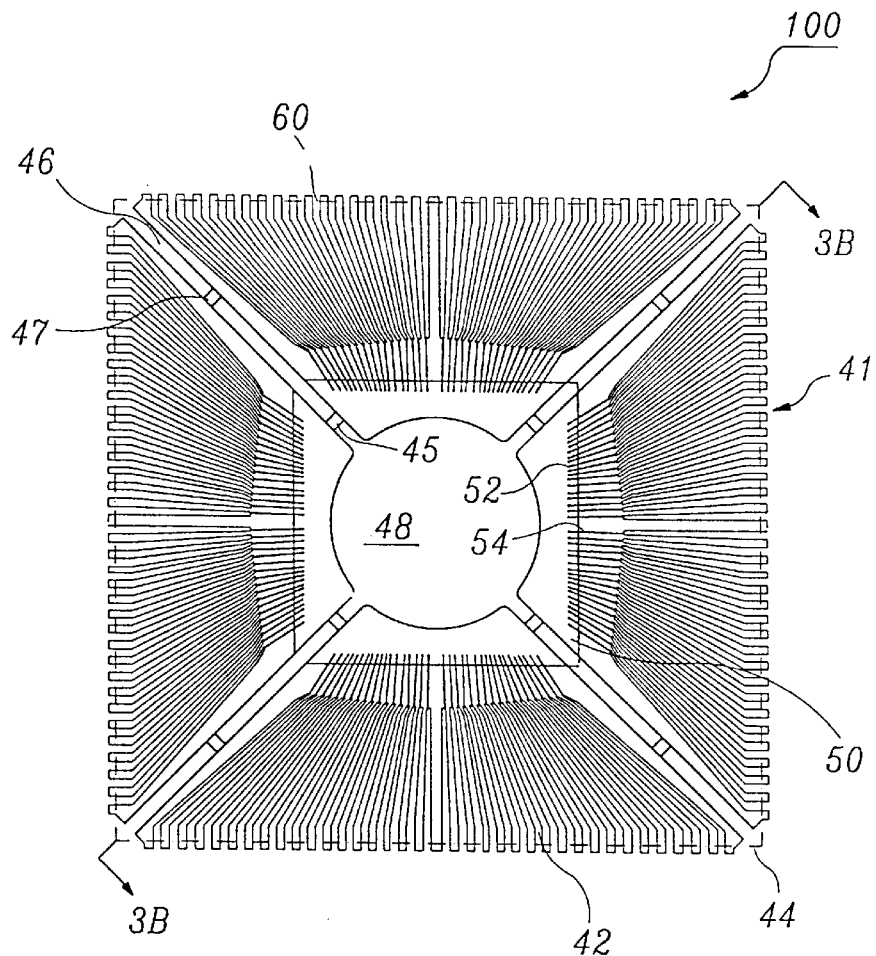
FIG. 3A is a plan view depicting a quad type semiconductor device package using a small-sized die pad according to the present invention.

In the example embodiment shown in FIG. 2A through FIG. 2C, a semiconductor device package using the small-sized die pad of the present invention produces a so-called SOJ (Small Outline J-Leaded) package. In the SOJ package the outer leads 24 extend along two opposing edges of the package body 40 and each is bent vertically and horizontally to produce a J-shape. However, when a semiconductor chip has a very large number of input or output (I/O) pins, more leads are required. As shown in FIG. 3A, in this case it is common to form outer leads 41 along all four edges of a package body 60.

Figure 3B:
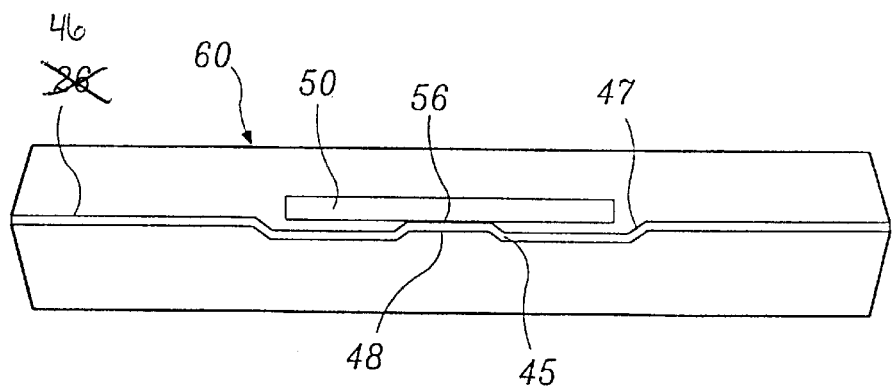
FIG. 3B is a cross-sectional view taken along the line 3B—3B in FIG. 3A.

With reference to FIG. 3A, a plurality of inner leads 42 are radially arranged around a die pad 48 having an almost circular shape, and four tie bars 46 are formed. In the preferred embodiment, each tie bar 46 has a downward bend 45 and an upward bend 47, which are positioned on the inside of the package body 60. In this quad type package, the electrode pads 52 are arranged along the four sides of the semiconductor chip 50, and are electrically connected to the inner leads 42 by bonding wires 54. FIG. 3B is a cross-sectional view taken along the line 3B—3B in FIG. 3A. Here the adhesive layer 56 and the upward vertical displacement and the downward vertical displacement of the tie bar are depicted. Since the functions and the forming method of the downward bend 45 and the upward bend 47 of the tie bars 46 are the same as in the SOJ package described with reference to the FIG. 2, the detailed description is not repeated here.

Figure 4:
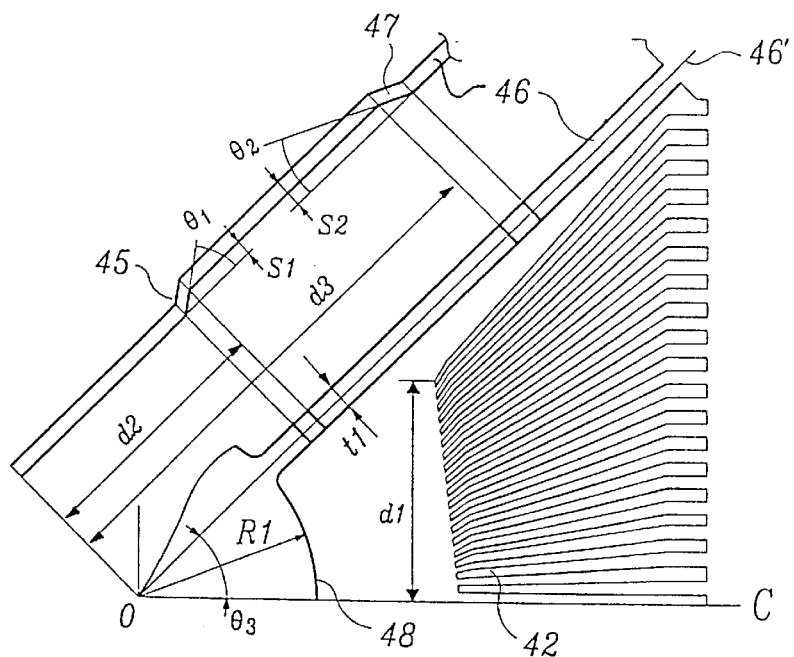
FIG. 4 is a magnified plan view of a portion of a quad type lead frame and a tie bar, combined with a perspective view of the tie bar, the combination depicting the size and the position of a downward bend and an upward bend of a twice-bent tie bar according to the present invention.

The sizes and the positions of the downward and the upward bends 45, 47 will be described with reference to FIG. 4 for the preferred embodiment of a quad type package. FIG. 4 is a magnified plan view of a portion of a quad type lead frame and a tie bar, combined with a perspective view of the tie bar, the combination depicting the size and the position of a downward bend and an upward bend of a twice-bent tie bar according to the present invention. The small-sized die pad 48 has an almost circular shape with a center at O and a radius $R_1$. In the preferred embodiment $R_1$ is 1.5 mm. A central ray C extends from O to the center of one edge of the package body. The distance $d_1$ is measured from the central ray C to the inner lead closest to the tie bar 46, and in a preferred embodiment $d_1$ is 4.07 mm. The angle $\theta_3$ is measured from the central ray C to the central line 46' of the tie bar 46. In the preferred embodiment $\theta_3$ is 45°. To illustrate this quad type package, it is assumed that the total number of the inner leads is 100. With this assumption, the width $t_1$ of the tie bar is approximately 0.3 mm.

The vertical dimensions of an example embodiment of the present invention are illustrated in the extended perspective view of the tie bar in FIG. 4. The downward bend 45 of the tie bar 46 has an angle $\theta_1$ of 40±5°. The downward bend 45 is formed on the tie bar at a location that is separated from the die pad center O at a distance $d_2$ of 2.3±0.1 mm and the downward vertical displacement $S_1$ of the downward bend 45 is approximately 0.1±0.025 mm. The upward bend 47 of the tie bar 46 has an angle $\theta_2$ of 40±5. The upward bend 47 is formed on the tie bar at a location separated from the die point center O at a distance $d_3$ of 6.5±0.1 mm and the upward vertical displacement $S_2$ of the upward bend 47 is approximately 0.265±0.025 mm.

The sizes and the distances of the upward and the downward bends, described in the above example embodiment of the present invention for a quad type package, can be varied according to the kinds of the package and the specifications of the apparatus used for manufacturing a given lead frame.

Figure 5:
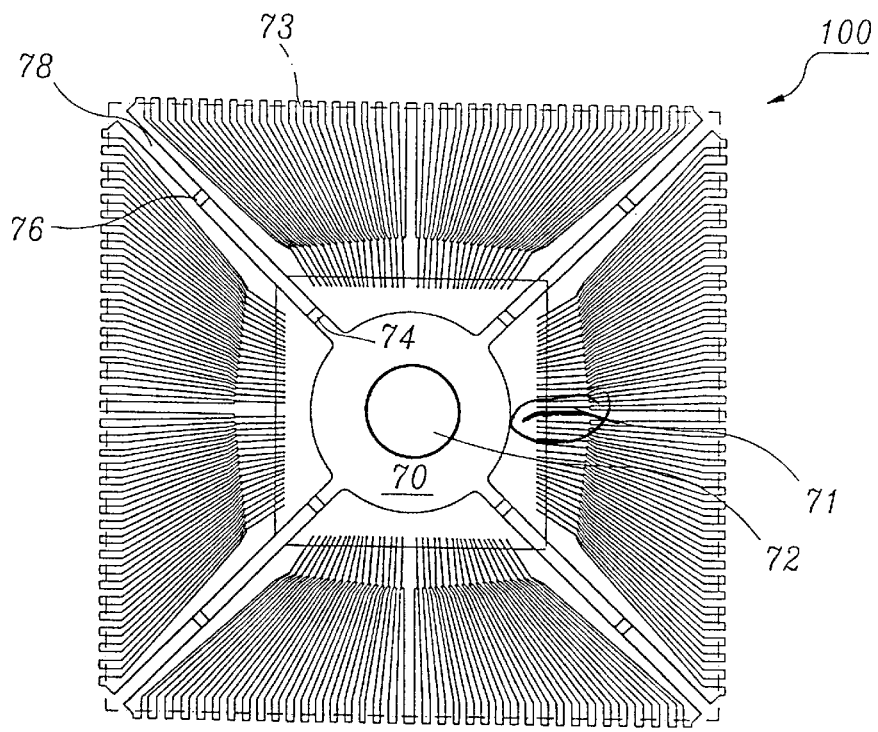
FIG. 5 is a plan view depicting a quad type semiconductor device package using a small-sized die pad having a through hole according to another embodiment of the present invention.

FIG. 5 is a plan view depicting a quad type semiconductor device package using a small-sized die pad having a through hole according to another embodiment of the present invention. With reference to FIG. 5, a through hole 72 is formed in the center of a die pad 70. The size of the through hole is smaller than the size of the semiconductor chip 71. After coating an adhesive on the upper surface of the die pad 70 and attaching the semiconductor chip 71 to the upper surface of the die pad 70, the molding process, which forms a package body 73 (dashed line), is carried out. In this case, since the molding compound directly contacts an additional area on the bottom surface of the semiconductor chip 71 via the through hole 72, the reliability of the package products can be improved due to the increased adhesion strength between the semiconductor chip and the package body. The tie bars 78 are formed on the respective four diagonal lines of the die pad 70 and a downward bend 74 and an upward bend 76 are formed on each tie bar 78, the details of which are similar to those described with respect to FIG. 4.

Figure 6:
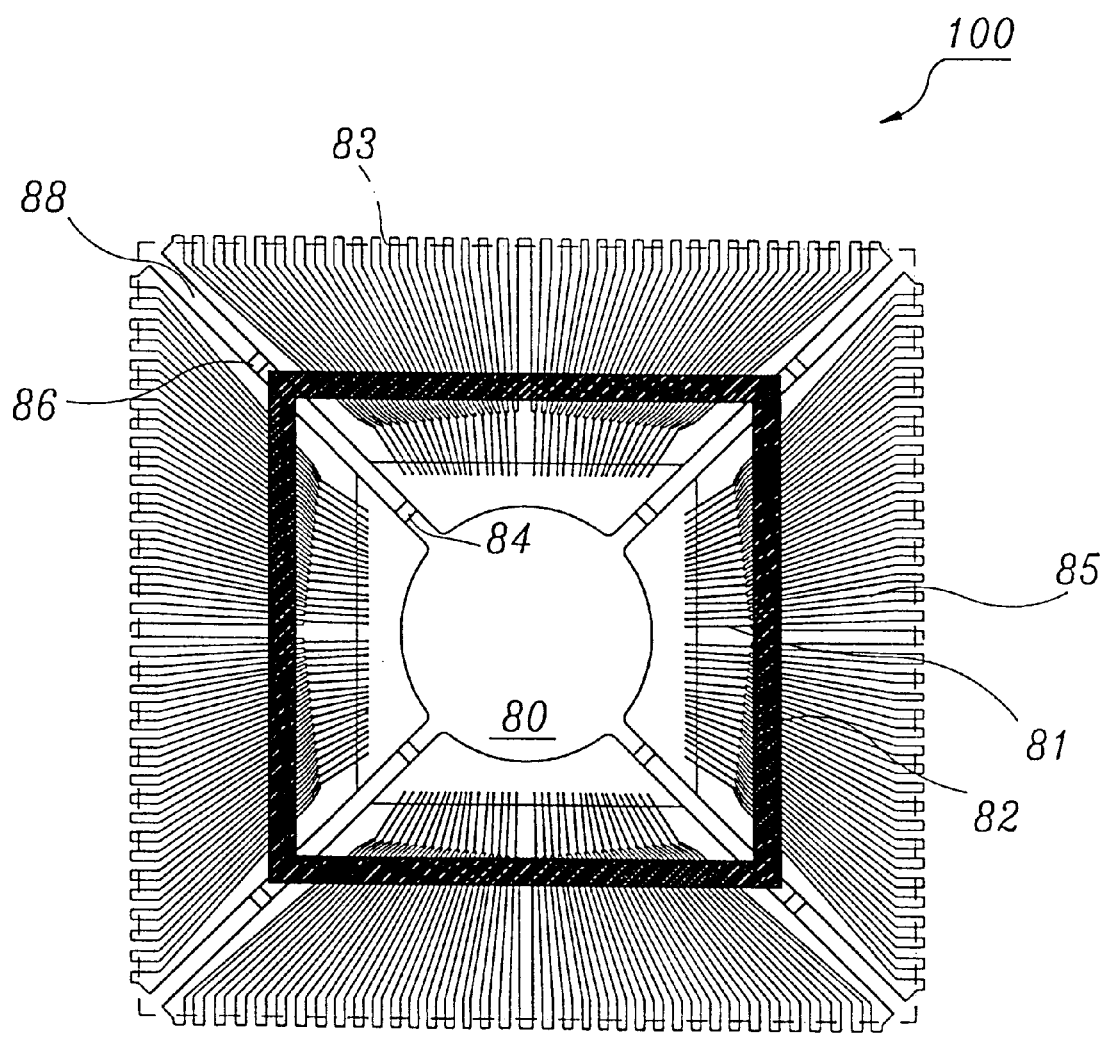
FIG. 6 is a plan view depicting a quad type semiconductor device package using a small-sized die pad and an electrically insulating tape attached to the upper surfaces of a plurality of inner leads according to another embodiment of the present invention.

FIG. 6 shows a plan view of a quad type semiconductor device package using a small-sized die pad and tape attached to the plurality of inner leads according to another embodiment of the present invention. In the quad type semiconductor device package in which a semiconductor chip 81 requires a large number of I/O pins, a plurality of the inner leads 85 are arranged so that the leads are radially oriented around the center of the circular die pad. In this arrangement, the pitch between the neighboring inner leads is very fine and the width of the lead is very thin. The liquid molding compound, which is injected with high pressure during the molding process, can damage the inner leads, for example, by laterally displacing or sweeping them. In order to prevent this disadvantage, after forming the downward bend 84 and the upward bend 86 on the tie bar 88, all the inner leads 85 are connected to each other by attaching an adhesive tape 82 to the inner leads 85. The adhesive tape 82 is an electrical insulator and provides lateral support to the inner leads that inhibits sweeping during the injection of the molding compound. The adhesive tape 82 can be attached to both the upper and the lower surfaces of the inner leads, or either surface alone.

The above-described semiconductor device package according to the present invention uses a die pad having a smaller size than that of the semiconductor chip and twice-bent tie bars having a downward bend and an upward bend. Therefore, imperfect encapsulation and resulting problems such as cracking of the package, and damage to the die pad, such as the warping of the die pad, can be prevented. Furthermore, the semiconductor chip can be arranged on the center of the package body by controlling the size of the downward bend and the upward bend. Therefore, the optimum vertical structure of the package can be obtained by the present invention.

In addition, the total adhesive strength between the semiconductor chip and the package body can be improved by forming a through hole in the center of the die pad, and the damage to the leads by the molding compound in the molding process can be prevented by connecting all the inner leads to each other with an adhesive tape.

Although preferred embodiments of the present invention have been described in detail, it should be clearly understood that many variations and modifications of the basic invention disclosed may appear to those skilled in the art, and still fall within the spirit and scope of the present invention as defined in the appended claims.

What is claimed is:

1. A semiconductor device package, comprising:
   a die pad having a semiconductor chip attached to an upper surface thereof and having a smaller lateral size than a lateral size of the semiconductor chip;
   a plurality of inner leads which are electrically connected to the semiconductor chip;
   a plurality of outer leads each of which is integral with a respective one of the plurality of inner leads;
   a tie bar for supporting the die pad, the tie bar having a downward bend effecting a downward vertical displacement and having a laterally spaced apart upward bend effecting an upward vertical displacement, wherein the downward bend commences at a location within a perimeter of the semiconductor chip; and
   a package body for encapsulating the semiconductor chip, the die pad, the tie bar, and the plurality of inner leads.

2. The semiconductor device package of claim 1, wherein the downward bend and the upward bend are encapsulated by the package body.

3. The semiconductor device package of claim 1, wherein the downward vertical displacement is equal to the upward vertical displacement.

4. The semiconductor device package of claim 1, wherein the downward vertical displacement is less than the upward vertical displacement.

5. The semiconductor device package of claim 1, wherein the upward bend commences at a point laterally spaced outwardly from the perimeter of the semiconductor chip.

6. The semiconductor device package of claim 1, wherein the downward vertical displacement is greater than a size of a filler, wherein the filler is contained in a molding compound for forming the package body.

7. The semiconductor device package of claim 1, wherein the die pad has a shape which is substantially circular and each of the inner leads is oriented substantially radially to a center of the die pad.

8. The semiconductor device package of claim 8, further comprising electrically insulating adhesive tape connected to the plurality of inner leads for maintaining separation among the plurality of inner leads.

9. The semiconductor device package of claim 1, wherein the die pad has a through hole positioned near a center of the die pad.

10. The semiconductor device package according to claim 1, wherein the downward and upward bends form a downset portion of the tie bar spanning across the perimeter of the semiconductor chip.

11. The semiconductor device package of claim 1, wherein a portion of the tie bar between the downward bend and the laterally spaced apart upward bend extends laterally in a direction parallel with the upper surface of the die pad and within the perimeter of the semiconductor chip.

12. A semiconductor device comprising:
    a semiconductor chip, having a plurality of electrodes, said semiconductor chip defining a periphery; and
    a lead frame including
       a die pad having the semiconductor chip attached to an upper surface thereof, said die pad having a lateral dimension which is less than a corresponding lateral dimension of the semiconductor chip attached thereto,
       a plurality of inner leads electrically connected to said plurality of electrodes,
       a plurality of outer leads each integrally attached to one of said plurality of inner leads, and
       a tie bar attached to and supporting said die pad, said tie bar having a downward bend away from the semiconductor chip, said downward bend being located beneath a lower surface of the semiconductor chip within said periphery and defining a space between the semiconductor chip and said tie bar,
       a portion of said tie bar subsequent said downward bend extending laterally in a direction parallel with the upper surface of said die pad and within said periphery; and
    a molding compound filling said space between the semiconductor chip and said tie bar.

13. The semiconductor device of claim 12, wherein said tie bar has an upward bend laterally spaced apart from said downward bend and outside of said periphery of the semiconductor chip.

* * * * *